US005663574A

United States Patent [19]
Hierold et al.

[11] Patent Number: 5,663,574
[45] Date of Patent: Sep. 2, 1997

[54] POWER SEMICONDUCTOR COMPONENT WITH MONOLITHICALLY INTEGRATED SENSOR ARRANGEMENT AS WELL AS MANUFACTURE AND EMPLOYMENT THEREOF

[75] Inventors: Christofer Hierold; Herbert Schwarzbauer, both of Munich, Germany

[73] Assignee: Siemens Aktiengesellschaft, Munich, Germany

[21] Appl. No.: 536,607

[22] Filed: Sep. 29, 1995

[30] Foreign Application Priority Data

Sep. 29, 1994 [DE] Germany ............... 44 34 894.0

[51] Int. Cl.$^6$ ................................................. H01L 23/58
[52] U.S. Cl. .................. 257/48; 257/328; 257/341; 257/379; 257/469
[58] Field of Search ................. 257/48, 341, 379, 257/380, 328, 469, 342; 324/72.5; 323/907, 282, 283; 327/538, 543; 361/87; 364/483, 492; 365/212, 201

[56] References Cited

U.S. PATENT DOCUMENTS 4,472,678  9/1984  Lauriello ................. 324/72.5
5,153,696 10/1992  Kayama ................... 357/41
5,237,262  8/1993  Ashley et al. ........... 323/284

FOREIGN PATENT DOCUMENTS

WO89/08928  9/1989  WIPO.

OTHER PUBLICATIONS

Arlt, "IGBT—Technik Vom Erfinder", Elektronik Industrie 1, 1991, pp. 14–18.

*Primary Examiner*—William Mintel
*Attorney, Agent, or Firm*—Hill, Steadman & Simpson

[57] ABSTRACT

The subject matter of the application is directed to a power semiconductor component, whereby, in addition to a load transistor, a plurality of transistors and resistors are monolithically integrated and form respective current mirrors together with the load transistor. Advantageously, resistors of polysilicon are produced simultaneously with gate electrodes, and resistors of aluminum are produced simultaneously with a contacting layer. A largely independent measurement of the load current, of the semiconductor temperature, and of the saturation voltage of the load transistor as well as an improvement in the measuring precision are possible as a result of the subject matter of the application.

9 Claims, 2 Drawing Sheets

POWER SEMICONDUCTOR COMPONENT WITH MONOLITHICALLY INTEGRATED SENSOR ARRANGEMENT AS WELL AS MANUFACTURE AND EMPLOYMENT THEREOF

BACKGROUND OF THE INVENTION

The temperature, the load current and the saturation voltage (on-state voltage) of a power semiconductor component, for example an IGBT or MOS-FET, are important operating quantities, a knowledge of which is advantageous for a disturbance-free and dependable operation of an electrical circuit with power semiconductor components in order to be able to recognize overload conditions in time and, potentially, to initiate suitable counter-measures for protecting the component and connected users.

IGBTs having integrated sensors for acquiring the load current are known, for example, from the article by Bodo Arlt having the title "IGBT-Technik vom Erfinder" in the periodical *Elektronik Industrie* 1–1992, pages 14–18. A test current is thereby generated with the assistance of a current mirror, this test current being converted with the assistance of an external resistor into a test voltage proportional to the load current.

However, a temperature increase given, for example, a constant load current leads to an increase in the test voltage and thus simulates an increased load current. The measuring error arising particularly occurs when the precision resistor is integrated within the active area of the power semiconductor and is heated in common with the component as a result of the load current.

SUMMARY OF THE INVENTION

An object of the invention is to specify a power semiconductor component that comprises an integrated current sensor with an integrated precision resistor wherein a temperature-independent acquisition of load current is nonetheless possible and a manufacture of which requires no additional process steps insofar as possible.

According to the invention, a power semiconductor component is provided comprising a load transistor and at least two further transistors and at least two resistors. The transistors and the resistors are monolithically integrated. The first series circuit of the first further transistor and the first resistor together with the load transistor forms a first current mirror. A first test voltage is present at the first resistor. A second series circuit formed of the second further transistor and the second resistor together with the load transistor forms a second current mirror. A second test voltage is present at the second resistor.

The invention shall be set forth in greater detail below with reference to the drawings.

DESCRIPTION OF THE PREFERRED EMBODIMENTS

Figure 1:
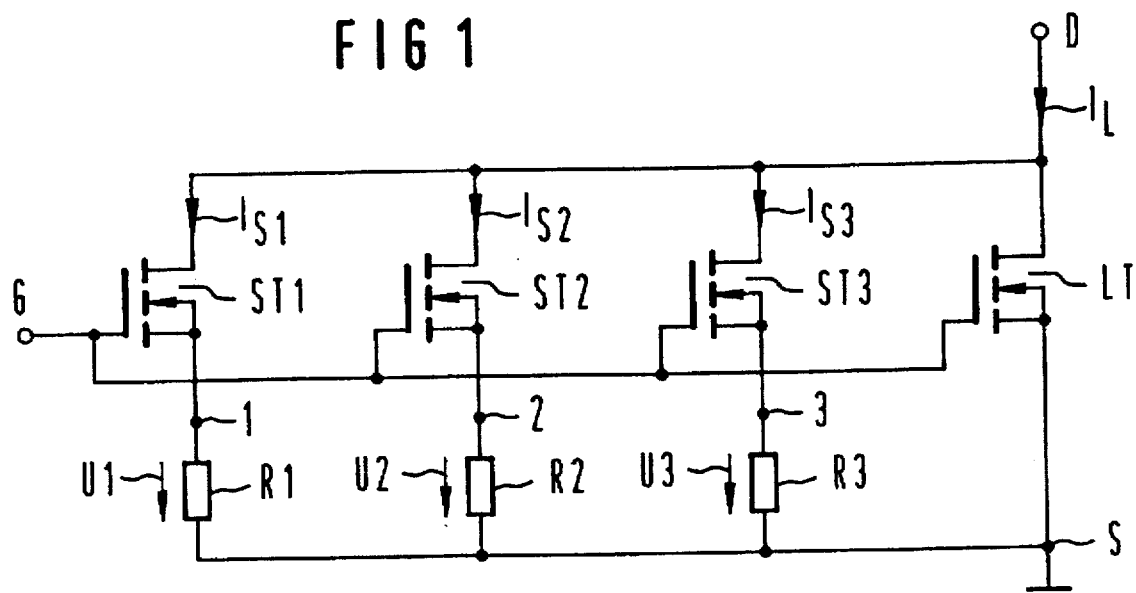
FIG. 1 is a simplified equivalent circuit diagram of a component according to the invention.

FIG. 1 shows a simplified, static equivalent circuit diagram of a power MOS-FET of the invention having a plurality of, for example, three sensor transistors ST1 . . . ST3, and a corresponding plurality of precision resistors, for example. The sensor transistors and precision resistors are monolithically integrated together with the load transistor and are respectively connected as a current mirror, whereby the gate terminals of the sensor transistors ST1 . . . ST3 and of the load transistor LT are connected to a common external gate terminal G, the drain terminals of the sensor transistors ST1 . . . ST3 and of the load transistor LT are connected to a common external drain terminal D, and respective source terminals 1 . . . 3 of the sensor transistors ST1 . . . ST3 are directly connected to a common external source terminal S via respective precision resistors R1 . . . R3 and the source terminal of the load transistor LT.

The source terminals 1 . . . 3 of the sensor transistors are available externally of the component terminals and, with reference to the reference potential of the source terminal S, carry test voltages U1 . . . U3 that represent voltage drops at the precision resistors R1 . . . R3 as a result of mirror currents $I_{S1} \ldots I_{S3}$ proportional to the load current $I_L$.

Figure 2:
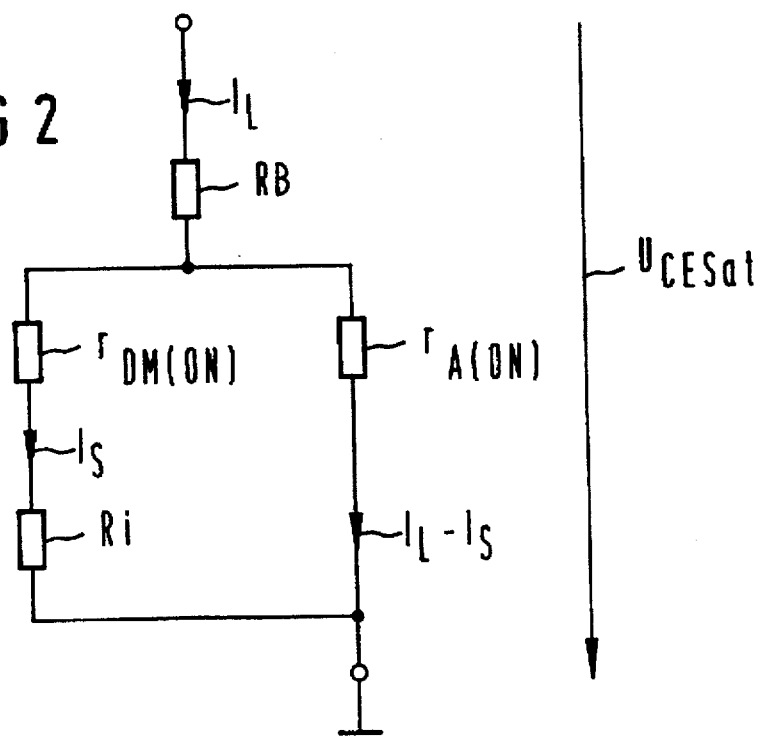
FIG. 2 is an equivalent circuit diagram of a part of the component of the invention for, among other things, explaining the identification of the saturation voltage.

FIG. 2 shows an equivalent circuit diagram of a part of the component of the invention, whereby the illustrated part reproduces a current mirror composed of a respective sensor transistor, the load transistor, and the precision resistor Ri in the activated condition. The equivalent circuit diagram is composed of what is referred to as a bulk resistor $R_B$ shared in common by the load transistor and mirror transistor, of an on-resistor $r_{DM(on)}$ of the sensor transistor, of an on-resistor $r_{A(on)}$ of the load transistor, and of the precision resistor Ri. The resistor $r_{DM(on)}$ and the precision resistor Ri are connected in series, the resistor $r_{A(on)}$ is connected in parallel thereto, and the resistor $R_B$ is in turn connected in series with this parallel circuit.

As soon as a load current $I_L$ flows, a minor current IS flows through the resistor $r_{DM(on)}$ and the precision resistor Ri, and a current IL-IS flows through the resistor $r_{A(on)}$. The saturation voltage $U_{CEsat}$ is across the entire series circuit. When the value of a precision resistor is selected relatively large, then nearly the entire saturation voltage $U_{CEsat}$ is present at the precision resistor.

Approximately valid for a voltage measurement, i.e. for $R_i \gg r_{DM(on)}$, is $$U_i = [r_{A(on)}/(r_{A(on)} + R_B)] U_{CEsat}.$$

Approximately valid for a current measurement, i.e. for $R_i \gg r_{DM(on)}$, is $$U_i = 1/(SF-1) * R_i I_L,$$

with $r_{DM(on)}/r_{A(on)}$ as a current mirror factor SF.

These two relationships describe two operating conditions for current mirrors that can be utilized for current and voltage measurement.

The resistors of the equivalent circuit diagram, $r_B$, $r_{DM(on)}$, $r_{A(on)}$, $R_i$ are temperature-dependent. In the operating condition, a temperature increase given, for example, a constant load current, then leads to a boost of the test voltage $U_i$ and thus simulates an increased load current $I_L$. In a first approximation, the relationship between $U_i$, $I_L$ and $\Delta T$ can be described as follows:

$$U_i = (k1 + k2\Delta T) * I_L = k1 * I_L + k2 * \Delta T I_L$$

with k1, k2 as proportionality constants.

An unambiguous identification of $I_L$ with only one current mirror is thus not possible without additional information about the temperature change $\Delta T$.

The following equation system describes a sensor arrangement with two current mirrors in a first approximation:

$$U1=(k11+k12\Delta T)*I_L=k11*I_L+K12*\Delta T I_L$$

with k11, k12 as proportionality constants.

$$U2=(k21+k22\Delta T)*I_L=k21*I_L+K22*\Delta T I_L$$

with k21, k22 as proportionality constants.

$$\begin{pmatrix} U1 \\ U2 \end{pmatrix} = \begin{pmatrix} k11 & k12 \\ k21 & k22 \end{pmatrix} * \begin{pmatrix} I_L \\ \Delta T * I_L \end{pmatrix} = K * \begin{pmatrix} I_L \\ \Delta T * I_L \end{pmatrix}$$

When K can be inverted, then the desired quantities $I_L$ and $\Delta T$ can be unambiguously identified as follows dependent on the sensor voltages:

$$\begin{pmatrix} I_L \\ \Delta T * I_L \end{pmatrix} = K^{-1} * \begin{pmatrix} U1 \\ U2 \end{pmatrix}$$

When three current mirrors are provided instead of two current mirrors, whereby the third current mirror with a precision resistor R3 can serve for the determination of the saturation voltage $U_{CEsat}$, then the sensor arrangement can be described by the following equation system.

$$\begin{pmatrix} U1 \\ U2 \\ U3 \end{pmatrix} = \begin{pmatrix} k11 & k12 & k13 \\ k21 & k22 & k23 \\ k31 & k32 & k33 \end{pmatrix} * \begin{pmatrix} I_L \\ \Delta T * I_L \\ U_{CEsat} \end{pmatrix} = K * \begin{pmatrix} I_L \\ \Delta T * I_L \\ U_{CEsat} \end{pmatrix}$$

Due to a suitable dimensioning of the current mirrors and of the precision resistors, the proportionality constants k13, k23,k31,k32 can be neglected and this equation system resolves into a two-dimensional equation system and a conditional equation for $U_{CEsat}$. When K can be inverted, the desired quantities $I_L$, $\Delta T$ and $U_{CEsat}$ can be unambiguously recited as follows dependent on the sensor voltages:

$$\begin{pmatrix} I_L \\ \Delta T * I_L \\ U_{CEsat} \end{pmatrix} = K^{-1} * \begin{pmatrix} U1 \\ U2 \\ U3 \end{pmatrix}$$

Figure 3:
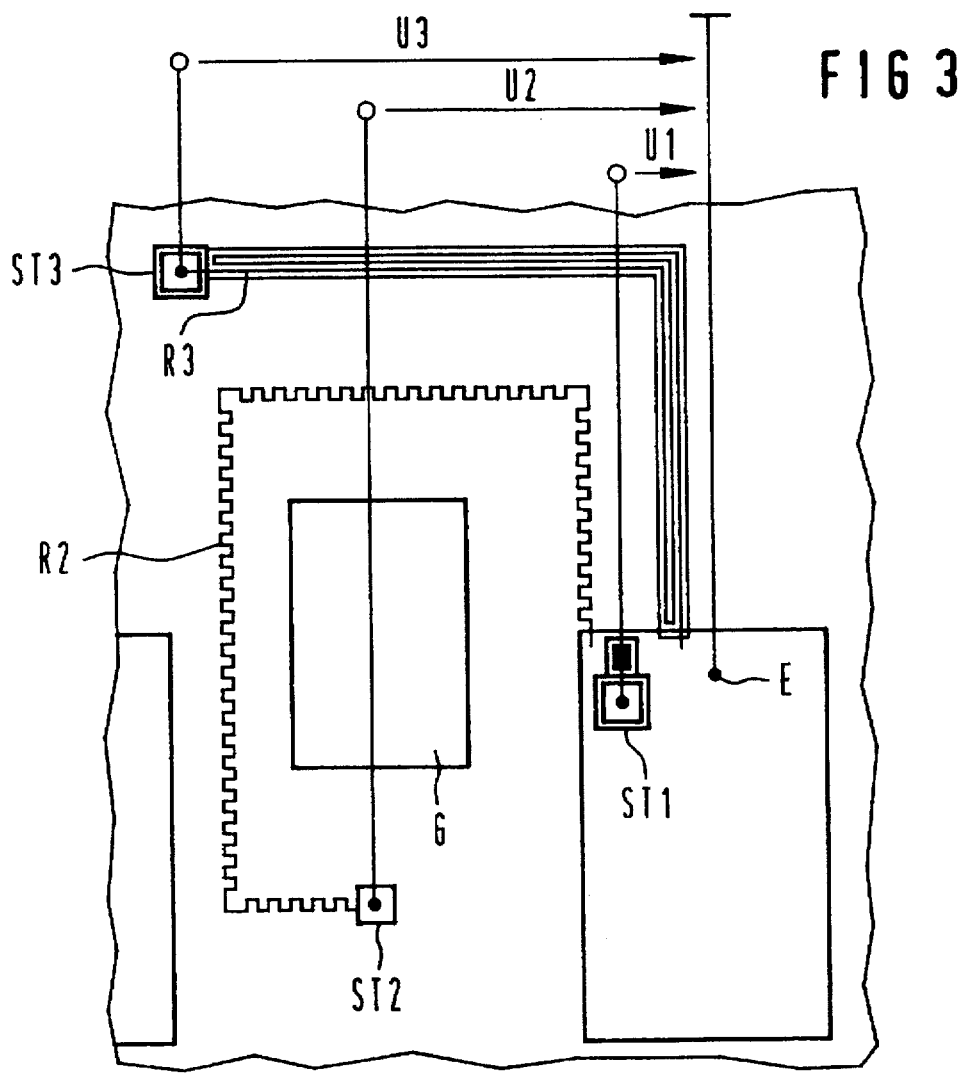
FIG. 3 is an illustration of a part of a component of the invention in a plan view.

FIG. 3 shows a plan view of a part of a component according to the invention, for example an IGBT having three sensor transistors ST1 . . . ST3 and three precision resistors R1 . . . R3. The precision resistors are thereby all connected at one side to a common main electrode, for example the emitter electrode E and the test voltages U1 . . . U3 are present at the other end of the respective precision resistor.

The resistor R1 is advantageously composed of polysilicon and the voltage U1 dropping off thereat serves the purpose of measuring the load current $I_L$. The resistor R2 is advantageously composed of aluminum and the voltage U2 dropping off thereat serves the purpose of measuring the temperature $\Delta T$. The resistor R3 is advantageously composed of polysilicon and the voltage U2 dropped thereat serves the purpose of measuring the load current.

A typical example of a suitable dimensioning of the precision resistors is composed of a value of resistance of respectively about 10 ohms for the precision resistors R1 and R2 and a value of resistance of about >=10 kOhms for the precision resistor R3.

The precision of the sensor arrangement can be enhanced by a suitable dimensioning of the current mirrors, by an appropriate number of transistor cells, and by a suitable selection of the material of the precision resistors. A current mirror having a great number of cells, for example 12 cells, and a precision resistor of polysilicon with a low temperature coefficient of about 0.1%/K is suitable for measuring $I_L$. Due to the high sheet resistivity of polysilicon of about 9 ohms/square, a large precision resistor of, for example, >10 kOhms can thus also be manufactured with a relatively small space requirement that, together with a current mirror having a low number of cells, for example <6 cells, is well-suited for $U_{CEsat}$. Due to its high temperature coefficient of about 0.4%/K, aluminum can be advantageously employed as a resistive material for a sensor for determining temperature.

Figure 4:
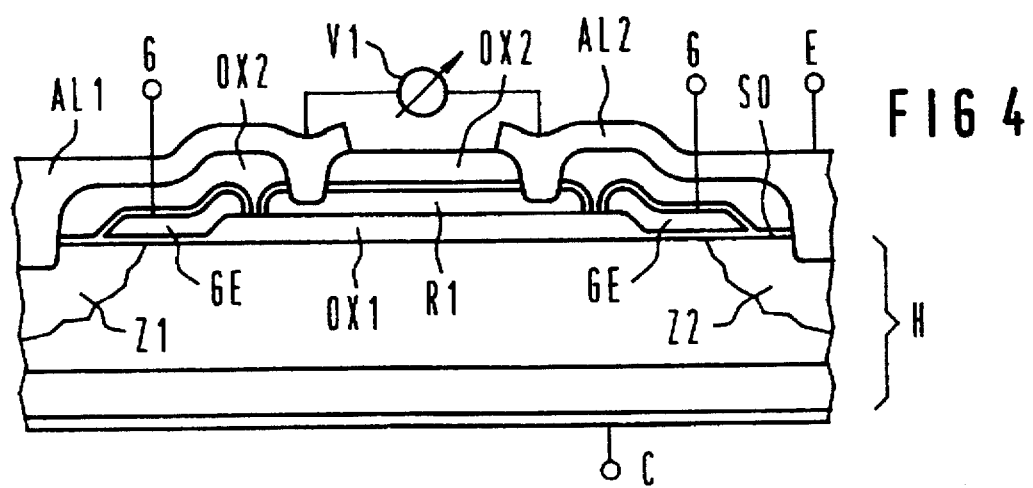
FIG. 4 is a sectional view of a component of the invention for explaining the process-compatible manufacture of a resistive track.

FIG. 4 shows a sectional view of a power semiconductor component of the invention that comprises a semiconductor body H on whose structuring surface SO a non-conductive layer OX1, for example a $SiO_2$ layer, is provided that insulates both a gate electrode GE as well as a resistive track for the precision resistor R1 from the semiconductor body H. This resistive track thus lies in a lateral region between two cells, whereby one cell Z1 forms a cell of a sensor transistor and one cell Z2 forms a cell of the load transistor LT and is composed, like the gate electrode, of polysilicon. A further non-conductive layer OX2, for example of $SiO_2$, separates a metallic contacting region composed of two separate regions AL1 and AL2 that, for example, is composed of aluminum, from the gate electrode GE. Through recesses in the further oxide layer, the region AL1 connects cells Z1 of the sensor transistor to a first end and the region AL2—that represents the contacting region for a main electrode, for example the electrode for an emitter terminal E—connects cells Z2 of the load transistor to the other end of the resistive track for the resistor R1. The gate electrode GE is connected to a gate terminal G, and a surface of the semiconductor body H facing away from the structuring surface SO is connected to a further main electrode, for example the electrode for a collector terminal C.

The high-impedance resistor R3 can be constructed similar to the resistor R1, the difference, for example, being only in the path or in the length of the respective resistive track.

The resistors R1 and R3 are preferably manufactured in common with the gate electrode GE, and the resistor R2 is preferably manufactured in common with the regions AL1 and AL2.

Due to a designational doping of the polysilicon that, however, denotes a change in the traditional manufacturing process, the temperature coefficient thereof can be set within broad ranges from negative to positive values.

Such techniques intensify the influence of the principal diagonal elements of the matrix K, compared to that of the secondary diagonal elements. In the ideal case, the secondary diagonal elements can be left out of consideration and the above equation system resolves into independent conditional equations for the measured quantities. This leads to an enhancement of the measuring precision and to a simplification of the interpretation of the sensor signals.

Sensor arrangements with more than three sensor transistors and precision resistors can be used for measuring the quantities $I_L$, $\Delta T$ and $U_{CEsat}$. The additional information (redundancy) enhances the measuring precision by reducing the influence of statistical fluctuations in measured values and makes it possible to consider non-linear parts in the dependencies of the test voltages Ui on the influencing quantities $I_L$, $U_{CEsat}$ and, particularly, $\Delta T$.

The following equation system describes the relationship between the test voltages Ui and the influencing quantities $I_L$, $\Delta T$ and $U_{CEsat}$ for a sensor arrangement with p (p>=3) sensors:

$$\begin{pmatrix} U1 \\ U2 \\ U3 \\ \cdot \\ \cdot \\ \cdot \\ Up \end{pmatrix} \begin{pmatrix} k11 & k12 & k13 \\ k21 & k22 & k23 \\ k31 & k32 & k33 \\ \cdot & & \\ \cdot & & \\ \cdot & & \\ kp1 & kp2 & kp3 \end{pmatrix} * \begin{pmatrix} I_L \\ \Delta T * I_L \\ U_{CEsat} \end{pmatrix} = K * \begin{pmatrix} I_L \\ \Delta T * I_L \\ U_{CEsat} \end{pmatrix}$$

When $K^T*K$ can be inverted, where $K^T$ is the transposed matrix K, then the desired quantities $I_L$, $\Delta T$ and $U_{CEsat}$ can be recited as follows, dependent on the sensor voltages:

$$\begin{pmatrix} I_L \\ \Delta T * I_L \\ U_{CEsat} \end{pmatrix} = K^+ * \begin{pmatrix} U1 \\ U2 \\ U3 \\ \cdot \\ \cdot \\ \cdot \\ Up \end{pmatrix}$$

with the pseudo-inverse $K^* = (K^T*K)^{-1}*K^T$.

Although various minor changes and modifications might be proposed by those skilled in the art, it will be understood that my wish is to include within the claims of the patent warranted hereon all such changes and modifications as reasonably come within my contribution to the art.

We claim as our invention:

1. A power semiconductor component, comprising:

a load transistor formed as a cell in a semiconductor body;

at least first and second further transistors and at least first and second resistors, the first and second transistors, load transistor, and first and second resistors being monolithically integrated on the semiconductor body, the first further transistor being formed as a cell in the semiconductor body;

the first resistor being a precision resistor having a resistive track lying in a lateral region between the load transistor cell and first further transistor cell on a non-conductive layer on a surface of the semiconductor body between the two cells;

a first series circuit of the first further transistor and the first resistor, said first series circuit together with the load transistor forming a first current mirror, a first test voltage being present across said first resistor; and a second series circuit of said second further transistor and said second resistor, said second series circuit together with said load transistor forming a second current mirror, a second test voltage being present across said second resistor.

2. A power semiconductor component according to claim 1 wherein said first resistor is comprised of polysilicon and said second resistor is comprised of aluminum.

3. A power semiconductor component according to claim 1 further including a third series circuit of a third further transistor and a third resistor, said third series circuit together with said load transistor forming a third current mirror, a third test voltage being present across said third resistor, and said third resistor being comprised of polysilicon and having an impedance which is at least two orders of magnitude higher than an impedance of said first resistor.

4. A power semiconductor component according to claim 3 wherein said third further transistor has fewer than half a number of cells as said first further transistor.

5. A power semiconductor component according to claim 1 wherein the first further transistor and first resistor are dimensioned for identifying load current of the load transistor, and the second further transistor and second resistor are dimensioned for identifying semiconductor temperature of the load transistor.

6. A power semiconductor component according to claim 5 further including a third series circuit of a third further transistor and a third resistor which together with the load transistor forms a third current mirror, a third test voltage being present at said third resistor, and wherein said third further transistor and third resistor are dimensioned for identifying saturation voltage of the load transistor.

7. A power semiconductor component, comprising:

a load transistor formed as a cell in a semiconductor body;

at least first and second further transistors and at least first and second resistors, the first and second transistors, load transistor, and first and second resistors being monolithically integrated on the semiconductor body, the first further transistor being formed as a cell in the semiconductor body;

the first resistor being a precision resistor having a resistive track lying in a lateral region between the load transistor cell and first further transistor cell on a non-conductive layer on a surface of the semiconductor body between the two cells, a gate electrode of the load transistor cell and a gate electrode of the first further transistor cell both also being insulated from said semiconductor body by said non-conductive layer;

a first series circuit of the first further transistor and the first resistor, said first series circuit together with the load transistor forming a first current mirror, a first test voltage being present across said first resistor representative of a first operating parameter of said load transistor; and a second series circuit of said second further transistor and said second resistor, said second series circuit together with said load transistor forming a second current mirror, a second test voltage being present across said second resistor representative of a second operating parameter of said load transistor.

8. A component according to claim 7 wherein said first operating parameter is a load current of said load transistor and said second operating parameter is a semiconductor temperature of said load transistor.

9. A component according to claim 3 wherein a resistance path for said third resistor runs in a region between said load transistor cell and a cell of said third further transistor in said semiconductor body.

* * * * *